(12) United States Patent
Uehling et al.

(10) Patent No.: US 8,766,453 B2
(45) Date of Patent: Jul. 1, 2014

(54) PACKAGED INTEGRATED CIRCUIT HAVING LARGE SOLDER PADS AND METHOD FOR FORMING

(71) Applicants: Trent S. Uehling, New Braunfels, TX (US); Brett P. Wilkerson, Austin, TX (US)

(72) Inventors: Trent S. Uehling, New Braunfels, TX (US); Brett P. Wilkerson, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 28 days.

(21) Appl. No.: 13/660,243

(22) Filed: Oct. 25, 2012

(65) Prior Publication Data
US 2014/0117554 A1 May 1, 2014

(51) Int. Cl.
*H01L 29/40* (2006.01)
*H01L 23/48* (2006.01)
*H01L 23/52* (2006.01)

(52) U.S. Cl.
USPC .............................. 257/773; 257/775; 257/786

(58) Field of Classification Search
USPC .......................................... 257/773, 775, 786
See application file for complete search history.

(56) References Cited

U.S. PATENT DOCUMENTS

| | | | |
|---|---|---|---|
| 5,285,352 A | 2/1994 | Pastore et al. | |
| 5,583,377 A | 12/1996 | Higgins | |
| 5,641,946 A | 6/1997 | Shim | |
| 5,798,571 A * | 8/1998 | Nakajima | 257/784 |
| 5,894,410 A | 4/1999 | Barrow | |
| 6,696,763 B2 * | 2/2004 | Chen et al. | 257/778 |
| 7,227,256 B2 | 6/2007 | Zhao et al. | |
| 8,222,734 B2 * | 7/2012 | Moriyama et al. | 257/724 |
| 2002/0100955 A1 | 8/2002 | Potter et al. | |
| 2004/0245624 A1 | 12/2004 | Swanson et al. | |
| 2007/0132090 A1 * | 6/2007 | Kuwabara | 257/700 |
| 2009/0057887 A1 * | 3/2009 | Mclellan et al. | 257/737 |
| 2010/0007008 A1 | 1/2010 | Sano | |

OTHER PUBLICATIONS

U.S. Appl. No. 13/537,388, Uehling, T. et al., "A Semiconductor Package Structure Having an Air Gap and Method for Forming", filed Jun. 29, 2012.

* cited by examiner

*Primary Examiner* — Karen Kusumakar
(74) *Attorney, Agent, or Firm* — Joanna G. Chiu; James L. Clingan, Jr.

(57) ABSTRACT

A package substrate has a die mounted on a first side. One or more inner solder pads are on an inner portion of a second side. A perimeter of the inner portion is aligned with a perimeter of the die. The one or more inner solder pads are the only solder pads on the inner portion. The one or more inner solder pads number no more than five. A plurality of outer solder pads are on an outer portion of the second side. An average of areas of the one or more inner solder pads is at least five times an average of areas of the one or more inner solder pads. The plurality of outer solder ball pads are for receiving solder ball balls. The outer portion is spaced from the perimeter of the inner portion. The outer portion and the inner portion are coplanar.

20 Claims, 4 Drawing Sheets

US 8,766,453 B2

PACKAGED INTEGRATED CIRCUIT HAVING LARGE SOLDER PADS AND METHOD FOR FORMING

BACKGROUND

1. Field

This disclosure relates generally to semiconductor processing, and more specifically, to a semiconductor package structure having under-die pads.

2. Related Art

Ball Grid Array (BGA) is a semiconductor packaging technology in which a semiconductor die is mounted on a top surface of a BGA package substrate and a plurality of solder balls is formed in a grid pattern on a bottom surface of the BGA package substrate. The BGA package can then be attached to a printed circuit board (PCB), in which the grid of solder balls of the BGA package forms electrical connections between the die and the PCB. However, the coefficient of thermal expansion (CTE) of the semiconductor die is typically low compared to the BGA package substrate and compared to the PCB. This results in a region of high stress at the solder balls which are located directly below the die, in particular at those solder balls which are located directly below the die edges. The die edges form the highest regions of stress due to the die being mechanically attached to the BGA package substrate by a die attach adhesive or underfill epoxy material. The BGA package substrate is thereby restrained by the die. The high stress region causes the BGA interconnects located within the region to mechanically fail before BGA interconnects outside of this region due to thermally induced stress.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one embodiment, in order to reduce stress induced failures resulting from the CTE mismatch between a semiconductor die and a package substrate in a package structure, such as a BGA package structure, large solder pads are formed under the die area. Directly under the die, on the underside of the package substrate, at most 5 large solder pads are formed in which each of the at most 5 large solder pads, referred to as inner solder pads, has an average area that is at least 5 times greater than an average area of all other solder ball pads. These large solder pads are also the only solder pads directly under the die. Due to their large size, these large solder pads present increased area for solder crack propagation, thus increasing the time required for a crack to create an electrical open circuit. In this manner, these large solder pads result in a higher reliability in an area that typically fails first during board-level cycling. Furthermore, in one embodiment, each of these large solder pads combine multiple power or ground BGA sites under the die. In this manner, not only is reliability of the solder pads directly under the die improved, but thermal path for these connections may be improved.

Figure 1:
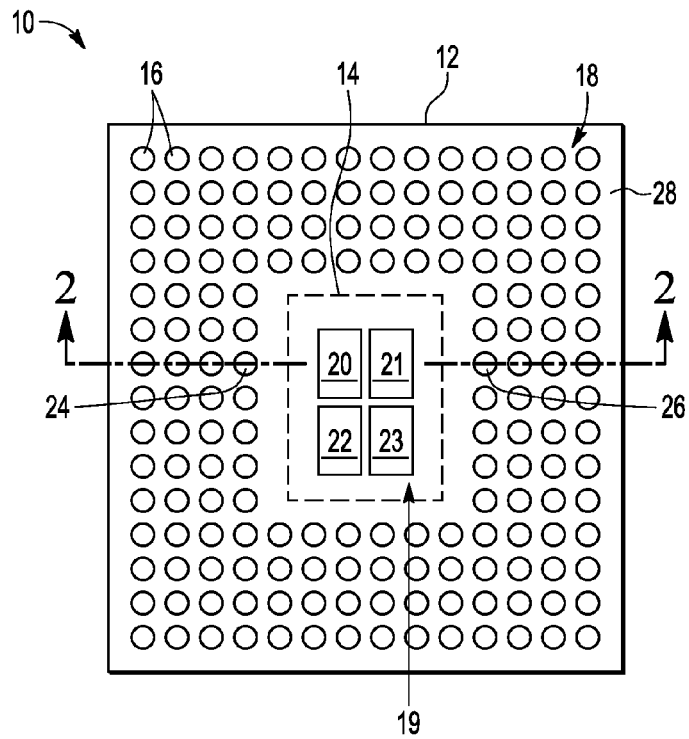
FIG. 1 illustrates a bottom view of a packed integrated circuit (IC) in accordance with an embodiment of the present disclosure.

FIG. 1 illustrates a bottom view of a packaged IC 10 in accordance with an embodiment of the disclosure. Packaged IC 10 includes a package substrate 12 having a first major surface, on which a die 14 is mounted, and a second major surface 18 opposite the first major surface. Therefore, in the bottom view of packaged IC 10, the first major surface is not visible, and the perimeter of die 14 is indicated by a dotted line labeled 14. This perimeter of die 14 on second major surface 18 devices also defines a perimeter of an inner portion 19 of second major surface 18. That is, the perimeter of inner portion 19 of second major surface 18 is aligned to (e.g. substantially the same as) the perimeter of die 14. An outer portion of second major surface 18 is spaced from the perimeter of inner portion 19 and extends towards the outer edges of substrate 12. Inner portion 19 and the output portion of second major surface 18 are coplanar. On inner portion 19, packaged IC 10 includes a plurality of large inner solder pads 20-23 and on the outer portion of second major surface 18, packaged IC 10 includes a plurality of outer solder pads 16 (which includes exemplary pads 24 and 26, and is exclusive of inner solder pads 20-23). Packaged IC 10 also includes a solder mask 28 located on second major surface 18 of substrate 12 which exposes outer solder pads 16 and inner solder pads 20-23. As will be described further below, each of outer solder pads 16 are for receiving a solder balls and may therefore be referred to as outer solder ball pads. Each inner solder pad may receive one or more solder balls. In one embodiment, each inner solder pad receives at least 5 solder balls. Alternatively, the inner solder pads may not receive any solder balls. Both the inner and outer solder pads are on second major surface 18 and are thus coplanar.

The large inner solder pads on inner portion 19 of second major surface 18 includes at most 5 large solder pads (in which the illustrated embodiment includes only 4 inner solder pads 20-23). Furthermore, the at most 5 larger inner solder pads are the only solder pads on inner portion 19. That is, each of the at most 5 large inner solder pads is on inner portion 19 and no other solder pads is on inner portion 19. Also, the at most 5 large inner solder pads has an average area, referred to as an inner solder pad average area, and the outer solder pads 16, which include all solder pads on second major surface 18 exclusive of any large inner solder pads on inner portion 19, has an average area, referred to as an outer solder pad average area. The inner solder pad average area is at least five times as great as the outer solder pad average area. In order to better achieve this greater inner solder pad average area, each large inner solder pad is non-circular.

In one embodiment, each large inner solder pad combines multiple power or ground sites under die 14. Each large inner solder pad may therefore carry a power supply voltage. In one embodiment, each of the at most 5 large inner solder pad carries a ground voltage.

In the illustrated embodiment, packaged IC 10 is a BGA package and package substrate 12 is a BGA package substrate. Therefore, each of outer solder pads 16 may be referred to as a BGA pad.

Figure 2:
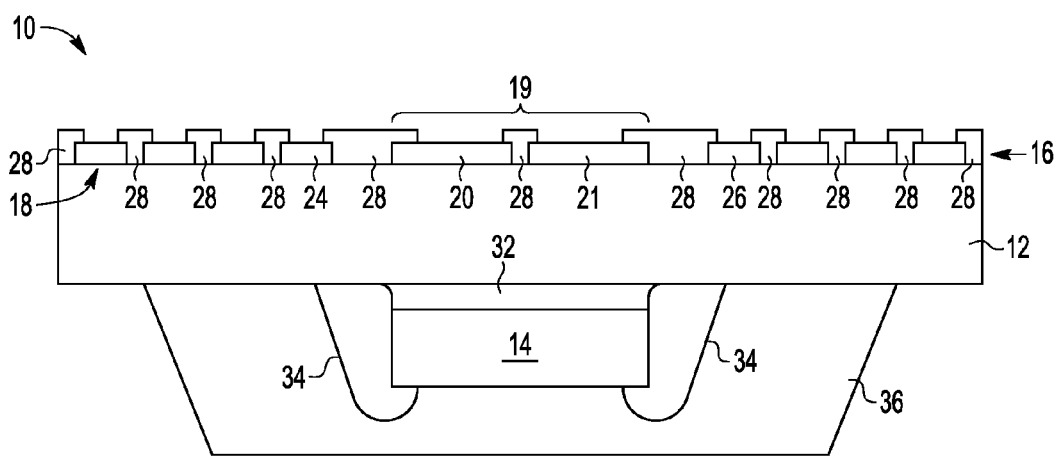
FIG. 2 illustrates a cross sectional view of the packaged IC of FIG. 1 at a stage in processing in accordance with one embodiment of the present disclosure.

FIG. 2 illustrates a cross sectional view of packaged IC 10 of FIG. 1 taken through some of solder pads 16 (such as exemplary solder ball pads 24 and 26) and large inner solder pads 20 and 21. Note that packaged IC 10 is illustrated as upside down such that second major surface 18 faces the top of the page and the first major surface of substrate 12 faces the bottom of the page. As can be seen in the cross section of FIG. 2, die 14 is mounted onto the first major surface of substrate 12 by way of a die attach 32 and is electrically connected to substrate 12 by way of wirebonds 34. Die 14, by of wirebonds 34 and electrical connections through substrate 12, is connected to solder pads 16 and 20-23. An encapsulant 36 surrounds die 14 and wirebonds 34. In alternate embodiments, other configurations may be used to mount die 14. For example, a flip chip configuration may be used to mount die 14 onto the first major surface of substrate 12. In this case, solder bump are used to electrically connect die 14 to substrate 12 and to solder pads 16 and 20-23. Solder mask 28 is on top of second major surface 18 and exposes a portion of each of outer solder pad 16 and each of inner solder pads 20 and 21.

Figure 3:
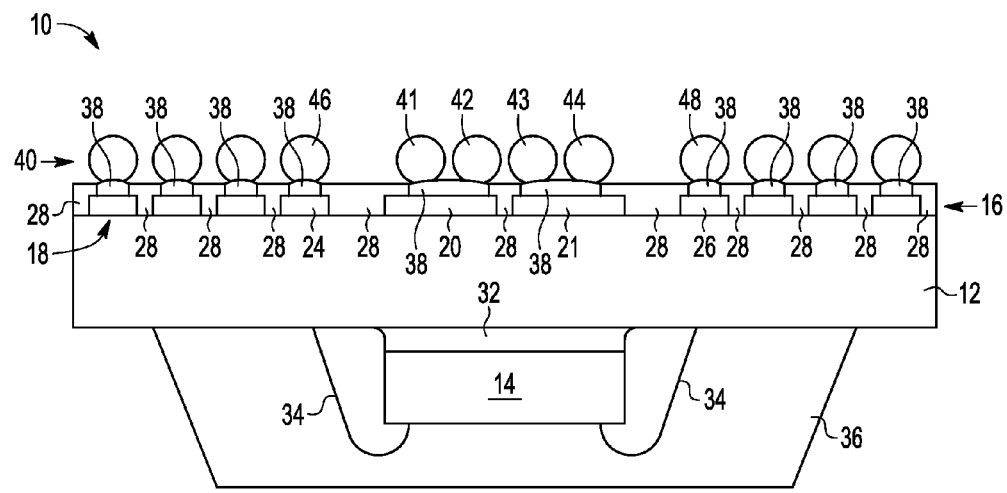
FIG. 3 illustrates a cross sectional view of the packaged IC of FIG. 2 at a subsequent stage in processing in accordance with one embodiment of the present disclosure.

FIG. 3 illustrates a cross sectional view of packaged IC 10 of FIG. 2 at a subsequent stage in processing in accordance with an embodiment of the present disclosure. A flux 38 is applied to all the solder pads (outer solder pads 16 and inner solder pads 20-23). Flux 38 is applied within the openings of solder mask 28 to make contact to each of the solder pad. After flux 38 is applied, solder balls 40 are placed on second major surface 18, in which the solder balls are place on flux 38 within the openings of solder mask 28. For each of outer solder pads 16, a single solder ball is placed on each outer solder pad. For example, referring to outer solder pad 24 and outer solder pad 26, a single solder ball 46 is placed on flux 38 on solder pad 24 and a single solder ball 48 is placed on flux 38 on solder pad 26. However, for any of the at most 5 inner solder pads, any number of solder balls may be placed on each of the inner solder pads. For example, in the cross section of FIG. 3, both solder balls 41 and 42 are placed on flux 38 on inner solder pad 20 and both solder balls 43 and 44 are placed on flux 38 on inner solder pad 21. Furthermore, although not visible in the cross section of FIG. 3, since large inner solder pads 20-21 are larger than outer solder pads 16, additional solder balls will be located in front and/or behind the page. In one embodiment, an average of at least 5 solder balls are placed on each of the at most 5 inner solder pads on inner portion 19. In another alternate embodiment, no solder balls are placed on the inner solder pads, and are only placed on outer solder pads 16. In another alternate embodiment, only minimal solder is placed on the inner solder pads. In one embodiment, solder balls 40 are placed using a stencil. Alternative, solder balls 40 are placed using a vacuum placement tool.

Figure 4:
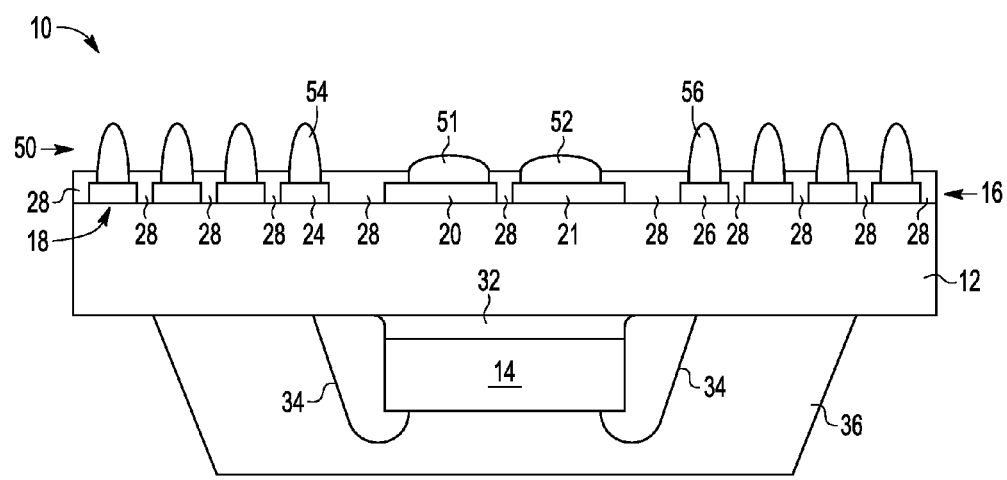
FIG. 4 illustrates a cross sectional view of the packaged IC of FIG. 3 at a subsequent stage in processing in accordance with one embodiment of the present disclosure.

FIG. 4 illustrates a cross sectional view of packaged IC 10 of FIG. 3 at a subsequent stage in processing in accordance with an embodiment of the present disclosure. Solder balls 40 are reflowed to result in reflowed solder balls 50 on each of the solder pads, and solder mask 28 keeps the solder in one opening from touching other solder in neighboring openings. That is, each solder pad which had flux 38 and a corresponding solder ball now has a corresponding reflowed solder ball 50 (also referred to as a reflowed solder bump). For example, outer solder pad 24 has a reflowed solder bump 54 on it, and outer solder pad 26 has a reflowed solder bump 56 on it. Also, in the illustrated embodiment, all the solder balls, such as solder balls 41 and 42, on inner solder pad 20 are formed into reflowed solder bump 51 on inner solder pad 20, and all the solder balls, such as solder balls 43 and 44, on inner solder pad 21 are formed into reflowed solder bump 52 on inner solder pad 21. Therefore, note that as a result of the reflow, the solder bumps on each of outer solder pads 16 extends higher from second major surface 18 as compared to the solder bumps (such as solder bumps 51 and 52) on any of the at most 5 inner solder pads on inner portion 19. That is, the tops of solder bumps 50 are not coplanar. The tops of solder bumps 50 on outer solder pads 16 may be coplanar with each other, but are not coplanar with the tops of solder bumps 50 located on any of the at most 5 inner solder pads. In one embodiment, the average volume of solder per solder pad on the at most 5 large inner solder pads is at least 5 times greater than an average volume of solder per solder pad on the outer solder pads.

Figure 5:
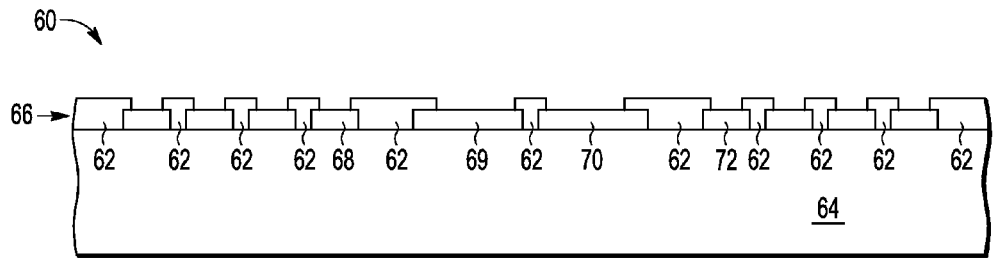
FIG. 5 illustrates a cross sectional view of a printed circuit board (PCB) at a stage in processing in accordance with one embodiment of the present disclosure.

FIG. 5 illustrates a cross sectional view of a printed circuit board (PCB) 60 at a stage in processing in accordance with an embodiment of the present disclosure. PCB 60 includes a PCB substrate 64, a plurality of PCB pads 66 (including outer PCB pads, such as outer PCB pads 68 and 72, and inner PCB pads, such as inner PCB pads 69 and 70), and a solder mask 62 which is over PCB substrate 64 and PCB pads 66 and includes openings which exposes each of PCB pads 66. Each inner PCB pad will be attached to a corresponding large inner solder pad of packaged IC 10, and each outer PCB pad will be attached to a corresponding outer solder pad of packaged IC 10.

Figure 6:
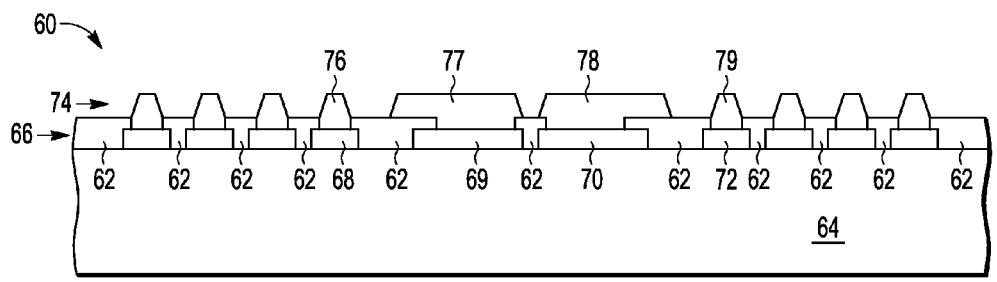
FIG. 6 illustrates a cross sectional view of the PCB of FIG. 5 at a subsequent stage in processing in accordance with one embodiment of the present disclosure.

FIG. 6 illustrates a cross sectional view of PCB 60 at a subsequent stage in processing in accordance with an embodiment of the present disclosure. A printed solder paste 74 is applied to PCB pads 66. Note that for each of the outer PCB pads, such as pads 68 and 72, which will be attached to an outer solder pad of packaged IC 10, the solder is printed such that the solder is printed substantially within the openings defined by solder mask 62. However, for the inner PCB pads, such as pads 69 and 70, the solder paste is over-printed, such that the solder paste overlaps onto solder mask 62. For example, printed solder paste 77 of printed solder paste 74 is printed onto inner PCB pad 69 and extends laterally onto the solder mask 62, and printed solder paste 78 of printed solder paste 74 is printed onto inner PCB pad 70 and extend laterally onto the solder mask 62. Printed solder paste 74 of each opening in solder mask 62 are separate so as not to form shorts, and each can laterally extend over solder mask 62 so long as it does not touch the printed solder paste of any neighboring PCB pad. Note that with the printed solder paste, the thickness of printed solder paste 74 is fairly even over all of substrate 64 (over each PCB pad 66). However, the amount of lateral extension of the printed solder past over onto solder mask 62 helps define a resulting amount of solder paste which will result over each PCB pad 66 (as will be seen below in FIG. 8). In this manner, the width of the applied printed solder paste 74 over each of the inner PCB pads, such as inner PCB pads 69 and 70, can help control the resulting volume of solder upon attached to packaged IC 10.

Figure 7:
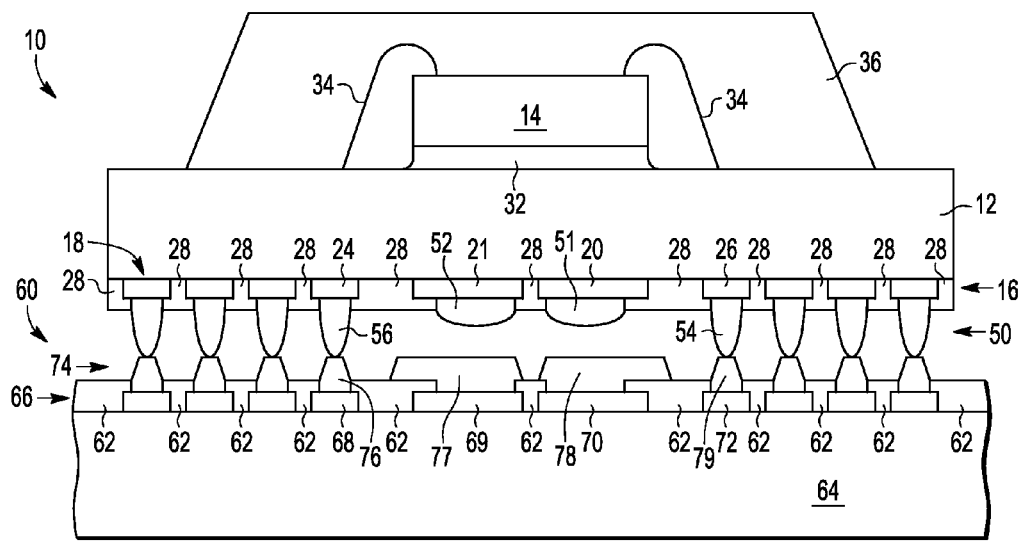
FIG. 7 illustrates a cross sectional view of the packaged IC of FIG. 4 being attached to the PCB of FIG. 5 at a stage in processing in accordance with one embodiment of the present disclosure.

FIG. 7 illustrates a cross sectional view of PCB 60 with packaged IC 10 placed on top, in preparation for attachment, in accordance with an embodiment of the present disclosure. Note that each of reflowed solder bumps 50 aligns with a corresponding PCB solder pad of PCB solder pads 66, in which each reflowed solder bump 50 aligns with a corresponding portion of printed solder paste 74. Therefore, outer reflowed solder bumps 56 and 54 align to outer PCB pads 68 and 72, respectively, and inner reflowed solder bumps 51 and 52 align to inner PCB pads 69 and 70, respectively. However, note that since, as was described above, the outer reflowed solder bumps of reflowed solder bumps 50 extend further from substrate 12 than inner reflowed solder bumps 50 and 51, when the outer reflowed solder bumps contact the printed solder paste on the outer PCB pads, a gap is present between inner reflowed solder bumps 51 and 52 and printed solder paste 77 and 78 on inner PCB pads 69 and 70. The extra lateral extension of printed solder paste 77 and 78, though, will be able to give more solder to these joints in order to make up for this gap upon attachment.

Figure 8:
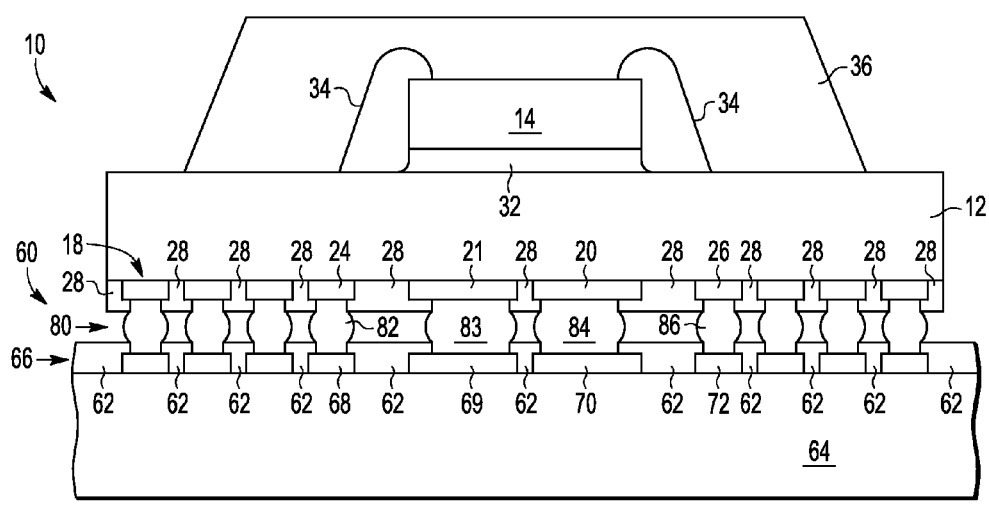
FIG. 8 illustrates a cross sectional view of the packaged IC and PCB of FIG. 7 at a subsequent stage in processing in accordance with one embodiment of the present disclosure.

FIG. 8 illustrates a cross sectional view of PCB 60 with packaged IC 10 attached to PCB 60, in accordance with an embodiment of the present disclosure. The full assembly is reflowed so that the reflowed solder bumps 50 attaches to printed solder paste 74 to form a plurality of solder joints 80 between PCB 60 and packaged IC 10. Solder joints 80 include outer solder joints, such as solder joints 82 and 86, which form a connections between outer solder pads on second major surface 18 of packaged IC 10 and the outer PCB pads of PCB 60, and inner solder joints, such as inner solder joints 83 and 84, which form connections between the large inner solder pads of packaged IC 10 and the inner PCB pads of PCB 60. Note that since there are at most 5 large inner solder pads on inner portion 19 of packaged IC 10, in which inner portion 19 is defined by the perimeter of die 14 and thus corresponds to a region directly under die 14, there are only at most 5 inner solder joints between packaged IC 10 and PCB 60. Note that the portions of printed solder paste 77 and 78 which extended laterally onto solder mask 62, during reflow, were pulled in to the formation of inner solder joints 83 and 84, respectively. In this manner, there was sufficient solder to reach up and attach to inner reflowed solder bumps 50 and 51 of packaged IC 10, which were inset in comparison to the outer reflowed solder bumps. Also, this results in the inner solder joints, such as joints 83 and 84, having a greater solder volume than the outer solder joints, such as joints 82 and 86. In one embodiment, the volume is at least 5 times greater. Also, as described above, only a minimal amount of solder may be applied to inner solder pads of packaged IC 10 (such as when no solder balls are placed onto the inner solder pads), in which case the printed solder paste of the inner PCB pads of PCB 60 can provide substantially all the solder for the inner solder joints. This may be done by sufficiently overlapping the printed solder past onto solder mask 62 of PCB 60.

Therefore, by now it can be appreciated how the placement of at most 5 large inner solder pads can better handle the higher stress areas located under die 14. By making the average area of the at most 5 large inner solder pads at least 5 times greater than the average area of the outer solder pads (which includes all other solder pads of second major surface 18 of packaged IC 10 exclusive of the at most 5 larger inner solder pads), robustness may be increases by prevention or better withstanding of cracks. Furthermore, by making at most 5 large inner solder pads on the inner portion of the major surface that is opposite the die and defined by the perimeter of the die, and not having any other solder pads on that inner portion other than the at most 5 large inner solder pads, the large solder pads can be more resistant to cracking or to propagation of cracks which do form. These at most 5 large inner solder pads may all carry ground to die 14, which allows for the routing of all ground to come from under die 14. In addition, these at most 5 large inner solder pads may increase heat transfer from packaged IC 10 to PCB 60.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the air gap can be formed within the die attach or within the package substrate of the package structure. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a packaged integrated circuit, including a package substrate; a die mounted to a first major surface of the package substrate; one or more inner solder pads on an inner portion of a second major surface of the package substrate, wherein the second major surface is opposite the first major surface, a perimeter of the inner portion is aligned with a perimeter of the die, the one or more inner solder pads are the only solder pads on the inner portion, the one or more inner solder pads number no more than five, and an average of areas of the one or more inner solder pads is an inner average; and a plurality of outer solder ball pads on an outer portion of the second major surface that comprise all of the solder ball pads on the second major surface exclusive of the one or more inner solder pads, wherein an average of areas of the plurality of outer solder ball pads is an outer average, the inner average area is at least five times the outer average, the plurality of outer solder ball pads are for receiving solder balls, the outer portion is spaced from the perimeter of the inner portion, and the outer portion and the inner portion are coplanar. Item 2 includes the packaged integrated circuit of claim 1, wherein each of the one or more inner solder pads are non-circular. Item 3 includes the packaged integrated circuit of item 1, wherein each of the one or more inner solder pads is for carrying a power supply voltage. Item 4 includes the packaged integrated circuit of item 3, wherein the power supply voltage is ground. Item 5 includes the packaged integrated circuit of item 4, and further includes solder on the outer solder ball pads and the one or more inner solder pads, wherein an average volume of solder on the one or more inner solder pads is at least five times an average volume of solder on the outer solder ball pads. Item 6 includes the packaged integrated circuit of item 5, wherein a height of the solder on the outer solder ball pads exceeds a height of the solder on the one or more inner solder pads. Item 7 includes the packaged integrated circuit of item 6, in which the packaged integrated circuit of item 6 is being attached to a printed circuit board, wherein the printed circuit board has outer solder joints attached to the solder on the outer solder ball pads and inner solder joints attached to the solder on the inner solder ball pads, wherein the inner solder joints extend further from surface of the printed circuit board than the outer solder joints extend from the surface of the printed circuit board. Item 8 includes the packaged integrated circuit of item 1, wherein the one or more inner solder pads number four. Item 9 includes the packaged integrated circuit of item 1, wherein the die is electrically attached to the one or more inner solder pads. Item 10 includes the packaged integrated circuit of item 1, wherein: the die is electrically attached to the one or more inner solder pads and the outer solder ball pads through the package substrate; and the die is covered with an encapsulant.

Item 11 includes a method of forming a packaged integrated circuit using a package substrate, the method including forming a plurality of outer solder ball pads and one or more inner solder pads on a first major surface of the package substrate, wherein: the inner solder pads are in an inner portion of the first major surface; a perimeter of the inner portion is aligned with a perimeter of a die region on a second major surface of the package substrate opposite the first major surface; the one or more inner solder pads are the only solder pads on the inner portion; the one or more inner solder pads number no more than five; an average of areas of the one or more inner solder pads is an inner average; the output solder ball pads are in an outer portion of the first major surface outside the perimeter of the inner portion; the outer solder ball pads comprise all of the solder pads on the first major surface exclusive of the one or more inner solder pads; an average of areas of the plurality of outer solder ball pads is an outer average; the inner average area is at least five times the outer average; the plurality of outer solder ball pads are for receiving solder balls; the outer portion is spaced from the perimeter of the inner portion; and the outer portion and the inner portion are coplanar. The method of item 11 further includes mounting a die on the second major surface in the die region. Item 12 includes the method of item 11, and further includes forming soldering flux on the one or more inner solder pads and the outer solder ball pads. Item 13 includes the method of item 12, and further includes placing solder balls on the soldering flux that is on the one or more inner solder pads and the outer solder ball pads. Item 14 includes the method of item 13, wherein the placing solder balls is further characterized by placing an average of at least five solder balls on the one or more inner solder pads. Item 15 includes the method of item 14, and further includes reflowing the solder balls. Item 16 includes the method of item 15, and further includes coupling the one or more inner solder pads to the die to provide a power supply to the die. Item 17 includes the method of item 15, and further includes encapsulating the die. Item 18 includes the method of item 15, and further includes attaching the packaged integrated circuit to a printed circuit board after the reflowing, the attaching comprising coupling the solder balls that have been reflowed to the printed circuit board.

Item 19 includes a packaged integrated circuit, including a package substrate having a first major surface and a second major surface; a die attached to the first major surface, a perimeter of the die defining an inner portion of the package substrate on the second major surface; a plurality of inner solder pads on the inner portion, wherein the plurality of inner solder pads is all of the solder pads in the inner portion, is no more than five solder pads, and has a first average area; and a plurality of outer solder pads that include all of the solder pads different from the plurality of inner solder pads on the second major surface, wherein the solder pads are for receiving solder balls, are on the second major surface, and have a second average area, wherein the first average area is at least five times the second average area. Item 20 includes the packaged integrated circuit of item 19, wherein the plurality of inner solder pads are for carrying ground to the die.

What is claimed is:

1. A packaged integrated circuit, comprising:
a package substrate;
a die mounted to a first major surface of the package substrate;
one or more inner solder pads on an inner portion of a second major surface of the package substrate, wherein the second major surface is opposite the first major surface, a perimeter of the inner portion is aligned with a perimeter of the die, the one or more inner solder pads are the only solder pads on the inner portion, the one or more inner solder pads number no more than five, and an average of areas of the one or more inner solder pads is an inner average; and
a plurality of outer solder ball pads on an outer portion of the second major surface that comprise all of the solder ball pads on the second major surface exclusive of the one or more inner solder pads, wherein an average of areas of the plurality of outer solder ball pads is an outer average, the inner average area is at least five times the outer average, the plurality of outer solder ball pads are for receiving solder balls, the outer portion is spaced from the perimeter of the inner portion, and the outer portion and the inner portion are coplanar.

2. The packaged integrated circuit of claim 1, wherein each of the one or more inner solder pads are non-circular.

3. The packaged integrated circuit of claim 1, wherein each of the one or more inner solder pads is for carrying a power supply voltage.

4. The packaged integrated circuit of claim 3, wherein the power supply voltage is ground.

5. The packaged integrated circuit of claim 4 further comprising solder on the outer solder ball pads and the one or more inner solder pads, wherein an average volume of solder on the one or more inner solder pads is at least five times an average volume of solder on the outer solder ball pads.

6. The packaged integrated circuit of claim 5, wherein a height of the solder on the outer solder ball pads exceeds a height of the solder on the one or more inner solder pads.

7. The packaged integrated circuit of claim 6 being attached to a printed circuit board, wherein the printed circuit board has outer solder joints attached to the solder on the outer solder ball pads and inner solder joints attached to the solder on the inner solder ball pads, wherein the inner solder joints extend further from surface of the printed circuit board than the outer solder joints extend from the surface of the printed circuit board.

8. The packaged integrated circuit of claim 1, wherein the one or more inner solder pads number four.

9. The packaged integrated circuit of claim 1, wherein the die is electrically attached to the one or more inner solder pads.

10. The packaged integrated circuit of claim 1, wherein:
the die is electrically attached to the one or more inner solder pads and the outer solder ball pads through the package substrate; and
the die is covered with an encapsulant.

11. A method of forming a packaged integrated circuit using a package substrate, comprising:
forming a plurality of outer solder ball pads and one or more inner solder pads on a first major surface of the package substrate, wherein:
the inner solder pads are in an inner portion of the first major surface;
a perimeter of the inner portion is aligned with a perimeter of a die region on a second major surface of the package substrate opposite the first major surface;
the one or more inner solder pads are the only solder pads on the inner portion;
the one or more inner solder pads number no more than five;
an average of areas of the one or more inner solder pads is an inner average;
the output solder ball pads are in an outer portion of the first major surface outside the perimeter of the inner portion;
the outer solder ball pads comprise all of the solder pads on the first major surface exclusive of the one or more inner solder pads;
an average of areas of the plurality of outer solder ball pads is an outer average;
the inner average area is at least five times the outer average;
the plurality of outer solder ball pads are for receiving solder balls;
the outer portion is spaced from the perimeter of the inner portion; and
the outer portion and the inner portion are coplanar; and
mounting a die on the second major surface in the die region.

12. The method of claim 11, further comprising forming soldering flux on the one or more inner solder pads and the outer solder ball pads.

13. The method of claim 12, further comprising placing solder balls on the soldering flux that is on the one or more inner solder pads and the outer solder ball pads.

14. The method of claim 13, wherein the placing solder balls is further characterized by placing an average of at least five solder balls on the one or more inner solder pads.

15. The method of claim 14, further comprising reflowing the solder balls.

16. The method of claim 15, further comprising coupling the one or more inner solder pads to the die to provide a power supply to the die.

17. The method of claim 15, further comprising encapsulating the die.

18. The method of claim 15, further comprising attaching the packaged integrated circuit to a printed circuit board after the reflowing, the attaching comprising coupling the solder balls that have been reflowed to the printed circuit board.

19. A packaged integrated circuit, comprising:
a package substrate having a first major surface and a second major surface;
a die attached to the first major surface, a perimeter of the die defining an inner portion of the package substrate on the second major surface;
a plurality of inner solder pads on the inner portion, wherein the plurality of inner solder pads is all of the solder pads in the inner portion, is no more than five solder pads, and has a first average area; and
a plurality of outer solder pads that comprise all of the solder pads different from the plurality of inner solder pads on the second major surface, wherein the solder pads are for receiving solder balls, are on the second major surface, and have a second average area, wherein the first average area is at least five times the second average area.

20. The packaged integrated circuit of claim 19, wherein the plurality of inner solder pads are for carrying ground to the die.

* * * * *